(12) United States Patent
Blanz

(10) Patent No.: US 8,195,397 B2
(45) Date of Patent: Jun. 5, 2012

(54) APPARATUS AND METHOD FOR TIME MEASUREMENT IN DOWNHOLE MEASUREMENT PROCESSES

(75) Inventor: Martin Blanz, Celle (DE)

(73) Assignee: Baker Hughes Incorporated, Houston, TX (US)

( * ) Notice: Subject to any disclaimer, the term of this patent is extended or adjusted under 35 U.S.C. 154(b) by 438 days.

(21) Appl. No.: 12/353,323

(22) Filed: Jan. 14, 2009

(65) Prior Publication Data

US 2009/0187345 A1 Jul. 23, 2009

Related U.S. Application Data

(60) Provisional application No. 61/021,936, filed on Jan. 18, 2008.

(51) Int. Cl.
*G01V 1/40* (2006.01)
*H03B 9/14* (2006.01)
(52) U.S. Cl. ............................................. 702/6; 331/56
(58) Field of Classification Search ................. 702/6, 79; 331/56, 176; 367/25, 91
See application file for complete search history.

(56) References Cited

U.S. PATENT DOCUMENTS

| 6,522,212 B1* | 2/2003 | Kodim ........................... 331/176 |
| 7,046,584 B2 | 5/2006 | Sorrells et al. |
| 7,212,075 B2 | 5/2007 | Young et al. |
| 2004/0246059 A1 | 12/2004 | Varsamis et al. |
| 2009/0146746 A1* | 6/2009 | Unkrich et al. .................. 331/70 |

FOREIGN PATENT DOCUMENTS
JP        54087049        7/1979

OTHER PUBLICATIONS

Search Report for International Application No. PCT/US2009/031221. Mailed Sep. 7, 2009.
Written Opinion of the International Searching Authority for International Application No. PCT/US2009/031221. Mailed Sep. 7, 2009.
John R. Vig. "Quartz Crystal Resonators and Oscillators, for Frequency Control and Timing Applications, A Tutorial". U.S. Army Communications-Electronics Command. AMSEL-RD-C2-PT. Rev 8.4.2. Jan. 2000.

* cited by examiner

*Primary Examiner* — Bryan Bui
(74) *Attorney, Agent, or Firm* — Cantor Colburn LLP

(57) ABSTRACT

A time measurement device for a geologic downhole measurement tool is provided. The device includes a plurality of oscillators for measuring a time value. At least one of the plurality of oscillators has a first temperature range that is different from a second temperature range of at least another of the plurality of oscillators. A time measurement system and a method for providing a time measurement are also provided.

18 Claims, 3 Drawing Sheets

APPARATUS AND METHOD FOR TIME MEASUREMENT IN DOWNHOLE MEASUREMENT PROCESSES

CROSS REFERENCE TO RELATED APPLICATIONS

Under 35 U.S.C. §119(e), this application claims the benefit of U.S. Provisional Application No. 61/021,936, filed Jan. 18, 2008, the entire disclosure of which is incorporated herein by reference.

BACKGROUND OF THE INVENTION

1. Field of the Invention

The teachings herein relate to formation evaluation tools used in subterranean exploration, and in particular, to devices and techniques for measuring properties of geologic formations.

2. Description of the Related Art

Various tools are used in hydrocarbon exploration and production to measure properties of geologic formations during or shortly after the excavation of a borehole. The properties are measured by formation evaluation tools and other suitable devices, which are typically integrated into a bottomhole assembly.

Such tools provide for the measurement versus depth and/or time of one or more physical quantities in or around a borehole. The taking of these measurements may be referred to as "logging", and a record of such measurements may be referred to as a "log".

Examples of logging processes include measurement-while-drilling (MWD) and logging-while-drilling (LWD) processes, during which measurements of properties of the formations and/or the borehole are taken downhole during or shortly after drilling. The data retrieved during these processes may be transmitted to the surface, and may also be stored with the downhole tool for later retrieval.

The tools used in MWD and LWD processes are typically included as part of a bottomhole assembly located at the lower portion of a drillstring, and may include various sensors or transducers for continuously or intermittently measuring properties of the formations and/or borehole.

LWD formation evaluation tools use real-time clocks that, when post-processing the logged data, allow the data to be correlated with associated times and depths. Such clocks allow individual measurements performed during LWD to be assigned specific depths. One pre-condition for assuring accurate time (and thus depth) assignments is that both downhole and uphole clocks run synchronized.

One drawback associated with the use of LWD tools is that the downhole clock is typically subject to great temperature variations. Such temperature variations may occur in the range of, for example, 20 degrees Celcius to 175 degrees Celsius.

It is very difficult to provide a clock or other time measurement device that is accurate over such a large temperature range. Thus, in typical LWD processes, synchronization between the uphole and downhole clocks may be compromised due to inaccuracies in the downhole clock. This results in misalignment of log features recorded during the LWD process.

BRIEF DESCRIPTION OF THE INVENTION

Disclosed herein is a time measurement device for a geologic downhole measurement tool. The device includes a plurality of oscillators for measuring a time value. At least one of the plurality of oscillators has a first temperature range that is different from a second temperature range of at least another of the plurality of oscillators.

Also disclosed herein is a time measurement system for a geologic downhole measurement tool. The system includes: a plurality of oscillators, at least one of the plurality of oscillators having a first temperature range that is different from a second temperature range of at least another of the plurality of oscillators; and a processor for individually selecting one of the at least one and the at least another of the plurality of oscillators to measure a time value, based on an oscillator temperature.

Further disclosed herein is a method for providing a time measurement associated with a geologic downhole measurement. The method includes: positioning a measuring device at a depth of a borehole in a geologic formation, the measuring tool comprising a plurality of oscillators, at least one of the plurality of oscillators having a first temperature range that is different from a second temperature range of at least another of the plurality of oscillators; and selecting one of the at least one and the at least another of the plurality of oscillators based on an oscillator temperature and measuring a time value with the selected oscillator.

BRIEF DESCRIPTION OF THE DRAWINGS

The following descriptions should not be considered limiting in any way. With reference to the accompanying drawings, like elements are numbered alike.

DETAILED DESCRIPTION OF THE INVENTION

A detailed description of one or more embodiments of the disclosed system and method are presented herein by way of exemplification and not limitation with reference to the Figures.

Figure 1:
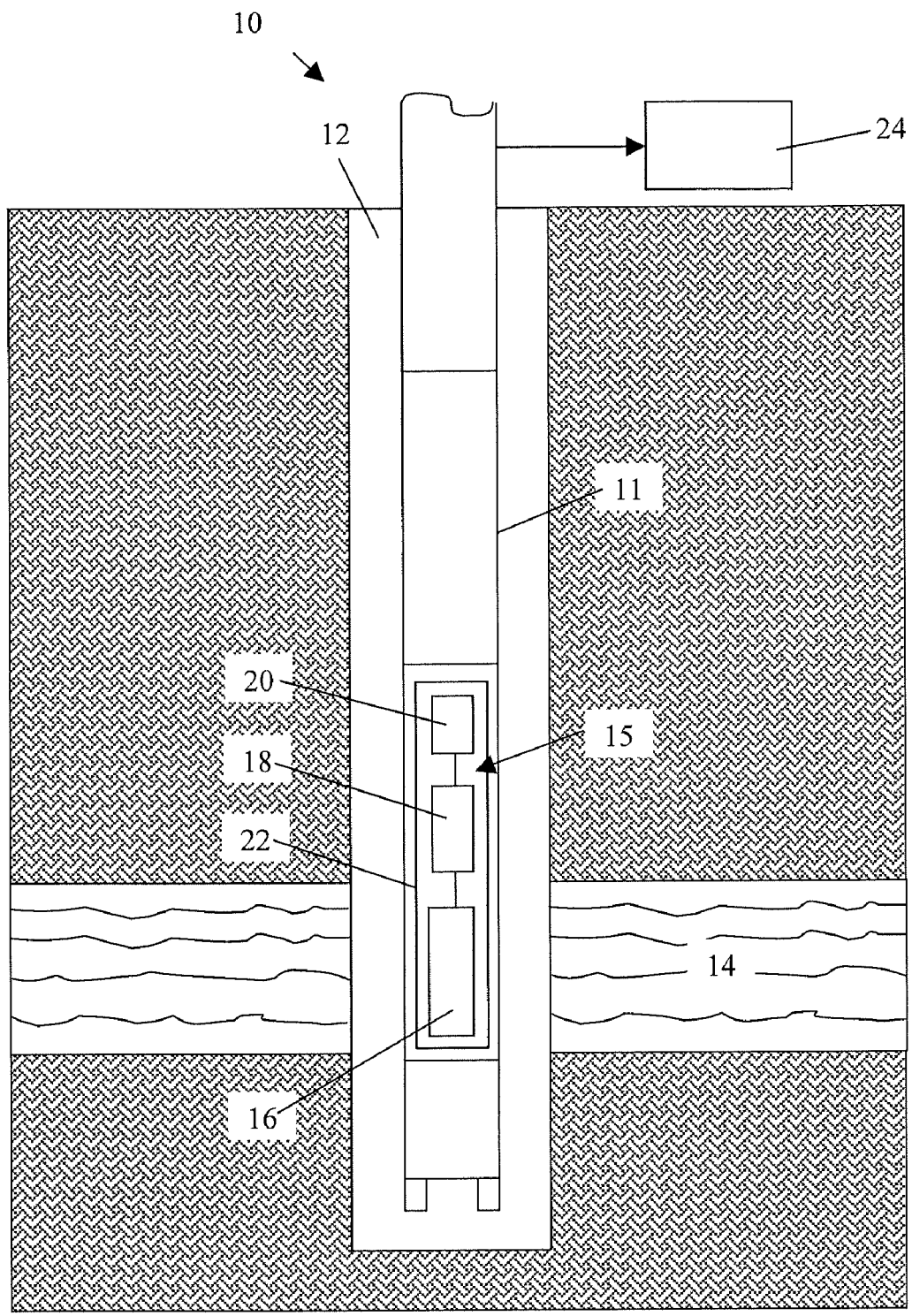
FIG. 1 depicts an embodiment of a well logging apparatus.

Referring to FIG. 1, an exemplary embodiment of a well logging apparatus 10 includes a drillstring 11 that is shown disposed in a borehole 12 that penetrates at least one earth formation 14 for making measurements of properties of the formation 14 and/or the borehole 12 downhole. As described herein, "formations" may refer to the various features and materials that may be encountered in a subsurface environment. Accordingly, it should be considered that while the term "formation" generally refers to geologic formations of interest, the term "formations," as used herein, may, in some instances, include any geologic points or volumes of interest (such as a survey area).

A downhole tool 15 may be disposed in the well logging apparatus 10 at or near the downhole portion of the drillstring 11, and may include various sensors or receivers 16 to measure various properties of the formation 14 as the tool 15 is lowered down the borehole 12. Such sensors 16 include, for example, nuclear magnetic resonance (NMR) sensors, resistivity sensors, porosity sensors, gamma ray sensors, seismic receivers and others.

The tool 15 may also include a clock 18 or other time measurement device for indicating a time at which each measurement was taken by the sensor 16. The tool 15 may further include an electronics unit 20. The sensor 16 and the clock 18 may be included in a common housing 22. The electronics unit 20 may also be included in the housing 22, or may be remotely located and operably connected to the sensor 16 and/or the clock 18. With respect to the teachings herein, the housing 22 may represent any structure used to support at least one of the sensor 16, the clock 18, and the electronics unit 20.

The tool 15 may be operably connected to a surface processing unit 24, which may act to control the sensor 16 and/or the clock 18, and may also collect and process data generated by the sensor 16 during the LWD or MWD process. The surface processing unit 24 may include components as necessary to provide for processing of data from the tool. Exemplary components include, without limitation, at least one processor, storage, memory, input devices, output devices and the like. As these components are known to those skilled in the art, these are not depicted in any detail herein.

The tool 15 may be equipped with transmission equipment to communicate ultimately to the processing unit 24. Connections between the tool 15 and the processing unit 24 may take any desired form, and different transmission media and methods may be used. Examples of connections may include wired, fiber optic, wireless connections or mud pulse telemetry. Further examples of connections may also include direct, indirect or networked connections between the tool 15 and the processing unit 24.

Figure 2:
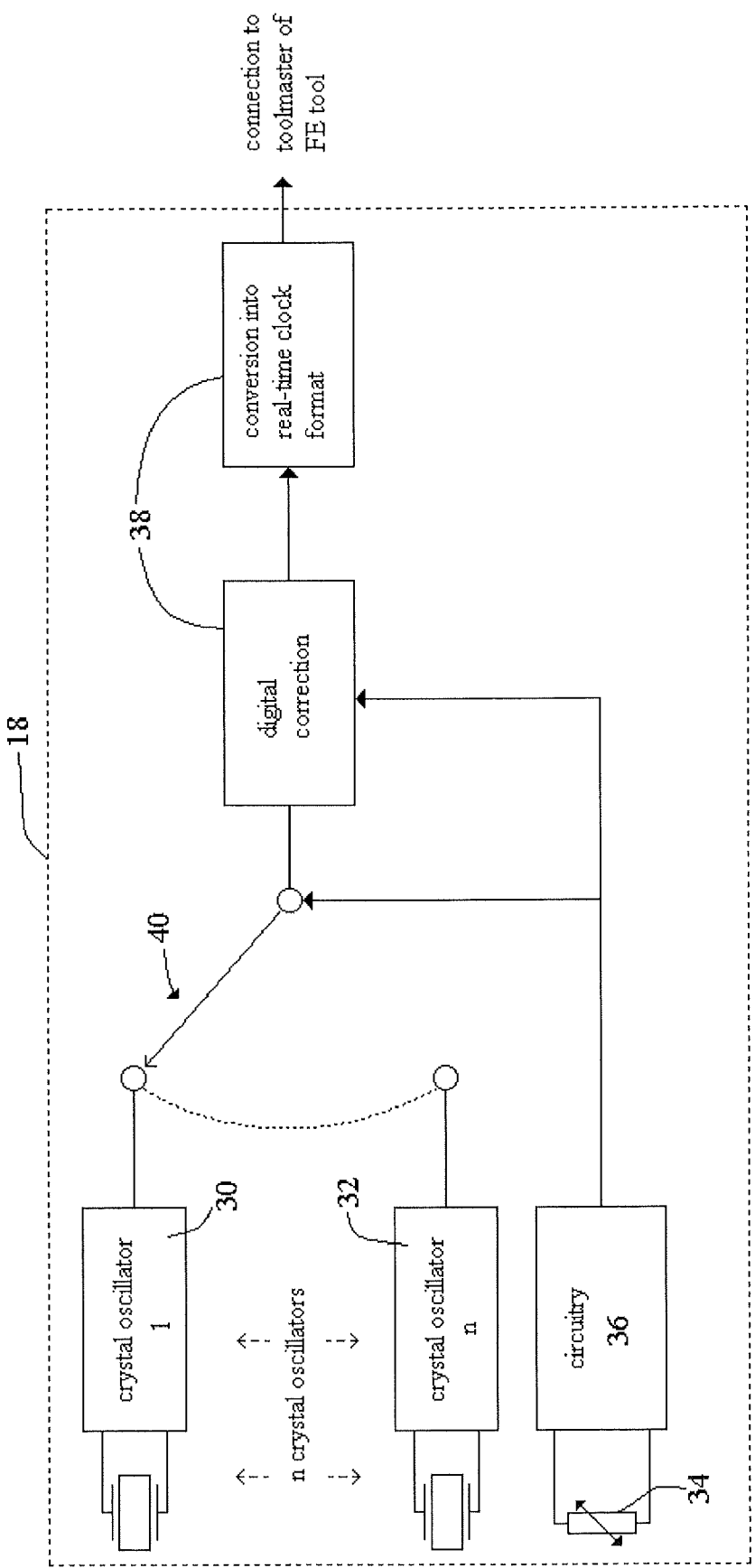
FIG. 2 depicts an embodiment of a time measurement device as described herein.

Referring to FIG. 2, the clock 18 is shown schematically to provide a frame of reference for the description following herein.

The clock 18 includes a plurality of oscillators 30 and 32, a temperature sensor 34, and control circuitry 36 (or other processor) connected to the temperature sensor 34. The temperature sensor may measure an oscillator temperature, which may include a temperature of one or more of the oscillators 30, 32, the clock 18, the tool 15 and any components thereof The clock 18 may also include processing circuitry 38 to process data received from the oscillators 30, 32. In one embodiment, the oscillators 30, 32 are crystal oscillators, such as oscillators including quartz crystals. Although in the embodiment of FIG. 2, the clock 18 includes two oscillators 30, 32, any number "n" of oscillators (oscillators 1 through n as shown in FIG. 2) may be used.

Each oscillator 30, 32 includes an associated temperature range, in which the oscillator 30, 32 is at least substantially temperature independent or has a known temperature dependency. As described herein, a "temperature range" associated with a respective oscillator 30, 32 represents a range of temperatures in which the oscillator 30, 32 is at least substantially temperature independent or has a known temperature dependency. The respective oscillator 30, 32 performs most accurately when the respective oscillator has a temperature within the associated temperature range.

In one embodiment, one or more of the oscillators 30, 32 has a temperature range that is defined as a range of temperatures within which the frequency of the oscillator 30, 32 is substantially temperature independent. Accordingly, changes in temperature within the temperature range do not cause any significant change in the output frequency of the respective oscillator 30, 32.

In another embodiment, one or more of the oscillators 30, 32 includes an associated temperature range in which the frequency of the oscillator 30, 32 has a known temperature dependency. Thus, the oscillation frequency of the oscillator 30, 32 can be accurately obtained based on the temperature of the oscillator 30, 32 within the temperature range, and/or changes in the oscillation frequency can also be accurately obtained based on temperature changes within the temperature range. For example, if the temperature dependency is well characterized in a certain temperature range and the temperature is known (e.g., by measurement), then an accurate time measurement in the certain temperature range can be performed.

In one embodiment, the clock 18 includes a number of the oscillators 30, 32, each of which have a respective temperature range. The number and type of the oscillators 30, 32 is selected so that the temperature ranges of each oscillator 30, 32, when combined, represent a selected overall temperature range. In one example, the oscillators 30, 32 are selected to represent an overall temperature range of approximately 20 degrees Celcius to approximately 175 degrees Celcius. As the temperature ranges of each type of oscillator 30, 32 may be known, each individual oscillator 30, 32 may be selected to cover, when combined, the overall temperature range. In one embodiment, at least one oscillator 30, 32 has a temperature range that overlaps with one or more other oscillators 30, 32.

The control circuitry 36 is electrically connected to the temperature sensor 34, and is also connected to the oscillators 30, 32 via a switch 40. In one embodiment, the control circuitry 36, in response to a temperature measurement from the temperature sensor 34, actuates the switch 40 as necessary to select the appropriate oscillator 30, 32. The "appropriate oscillator" is an oscillator 30, 32 whose temperature range includes the value of the temperature measurement. The appropriate oscillator 30, 32 is thus connected to the circuitry via the switch 40

In one embodiment, each oscillator 30, 32 may be individually connected to one or more power sources, such as a battery. The connection to the power source may be controlled by the control circuitry 36 to selectively power only the appropriate oscillator for a given temperature. This may be useful, for example, in preserving battery life.

The processing circuitry 38 may be operably connected to the oscillators 30, 32 via the switch 40 and receive data, such as a time signal, from the oscillator 30, 32 that was selected by the control circuitry 36. The processing circuitry 38 may process the data, for example, by applying any required corrections or compensations to the data. For example, an oscillator 30, 32 may have known compensations associated therewith. The data may also be converted to a real-time format. In addition, the processing circuitry 38 is in operable communication with a tool processor (not shown) for controlling the tool 15, referred to as the "toolmaster" of the FE (Formation Evaluation) tool in FIG. 2. The tool processor may be incorporated with the tool 15 or may be located remotely, such as at a surface. The tool processor, in one embodiment, includes sufficient storage and processing components to receive data including time signals from the clock 18 and the sensor 16 and to process the data, for example, to associate data from the sensor 16 and data from the clock 18 at a given depth.

In one embodiment, the clock 18 does not include separate circuitry or processors, and processing of the data as described above is performed by the control circuitry 36.

In one embodiment, in the instance that the temperature ranges of one or more oscillators 30, 32 overlap, the processing circuitry or processor 38 is configured to select the outputs of the multiple overlapping oscillators 30, 32 and apply at least one statistical operation to the outputs of the oscillators 30, 32, such as an average and/or a weighted average. A weighted average, in one embodiment, includes one or more weighing factors that depend on parameters such as accuracies of the oscillators 30, 32 at the actual measured temperature. This configuration may allow for increased clock accuracy to compensate for potential temperature dependency of an oscillator 30, 32 even within its temperature range.

Although the present embodiment provides the circuitry 36 and the processor 38 to both select the oscillator 30, 32 and process the data received from the oscillator 30, 32, any number or types of processors, circuits or devices for controlling operation of the clock 18 and/or processing of data may be provided. Such devices may include any suitable components, such as storage, memory, input devices, output devices and others.

As used herein, generation of data in "real-time" is taken to mean generation of data at a rate that is useful or adequate for making decisions during or concurrent with processes such as production, experimentation, verification, and other types of surveys or uses as may be opted for by a user or operator. As a non-limiting example, real-time measurements and calculations may provide users with information necessary to make desired adjustments during the drilling process. In one embodiment, adjustments are enabled on a continuous basis (at the rate of drilling), while in another embodiment, adjustments may require periodic cessation of drilling for assessment of data. Accordingly, it should be recognized that "real-time" is to be taken in context, and does not necessarily indicate the instantaneous determination of data, or make any other suggestions about the temporal frequency of data collection and determination.

Figure 3:
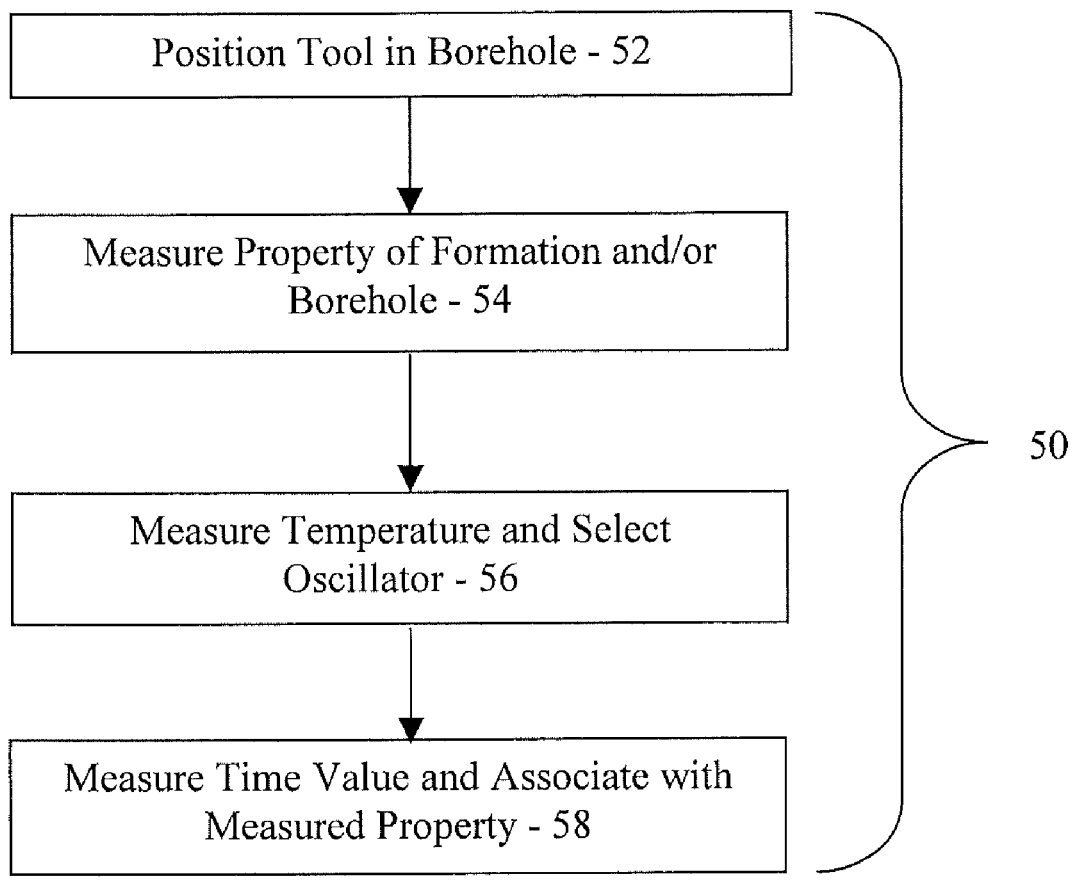
FIG. 3 is a flow chart providing an exemplary method for associating time information with geologic data.

FIG. 3 illustrates a method 50 for providing a time measurement associated with a geologic downhole measurement, such as a downhole measurement performed during a LWD process. The method 50 includes one or more stages 52, 54, 56 and 58. The method 50 is described herein in conjunction with the oscillators 30, 32, although the method 50 may be performed in conjunction with any number and configuration of oscillators. The method 50 may be performed by one or more processors or other devices capable of controlling operation of the oscillators 30, 32 and processing data. In one embodiment, the method includes the execution of all of stages 52, 54, 56 and 58 in the order described. However, certain stages may be omitted, stages may be added, or the order of the stages changed.

In the first stage 52, the tool 15 is positioned at a depth of a geologic formation 14. Positioning may include lowering the tool 15 during drilling of the borehole 12 or shortly thereafter.

In the second stage 54, one or more properties of the formation 14 and/or the borehole 12 are measured at the depth of the tool 15. This measurement may be accomplished using one or more of the sensors 16.

In the third stage 56, the temperature at and/or around the clock 18 is measured using, for example, the temperature sensor 34. The control circuitry then selects the oscillator 30, 32 having an associated temperature range that includes the measured temperature. In one embodiment, selection is accomplished by actuating the switch 40 to connect the selected oscillator 30, 32 to the processing circuitry 38. In another embodiment, power from a power source is connected only to the selected oscillator 30, 32, and power is removed from the remaining oscillators 30, 32 until a new oscillator is selected.

In the fourth stage 58, a time value is measured by receiving data from the selected oscillator 30, 32. In one embodiment, the time value is processed to apply any necessary compensations and/or convert the time value into a real-time format. Also in the fourth stage 58, the time value is associated with property measurement data received from the sensor 16. Such association may be performed by the tool processor, the processing unit 24 or any other suitable device.

The above method 50 may be performed continuously or intermittently as desired. As temperature values received from the temperature sensor 34 change, the circuitry 36 (or other suitable processor) may compare each temperature value and select the appropriate oscillator 30, 32 to ensure that an accurate time value is being received for each temperature range.

The systems and methods described herein provide various advantages over existing LWD tools that utilize existing clocks. The systems and methods described provide a highly accurate measurement of time that is not susceptible to variations in temperature experienced as the tool is lowered through the borehole. Accordingly, these systems and methods reduce or eliminate the need to synchronize uphole or surface clocks with the downhole clock described herein. This may be further advantageous in that synchronization downhole is generally not feasible or not precise if mud pulse telemetry is used as a means of communication between uphole and downhole components. Other advantages include both ease of operation and production, especially over large variations in temperature, as the production of multiple oscillators having smaller temperature ranges is more feasible than the production of a single oscillator having a large temperature range.

In support of the teachings herein, various analyses and/or analytical components may be used, including digital and/or analog systems. The system may have components such as a processor, storage media, memory, input, output, communications link (wired, wireless, pulsed mud, optical or other), user interfaces, software programs, signal processors (digital or analog) and other such components (such as resistors, capacitors, inductors and others) to provide for operation and analyses of the apparatus and methods disclosed herein in any of several manners well-appreciated in the art. It is considered that these teachings may be, but need not be, implemented in conjunction with a set of computer executable instructions stored on a computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user or other such personnel, in addition to the functions described in this disclosure.

Further, various other components may be included and called upon for providing aspects of the teachings herein. For example, a sample line, sample storage, sample chamber, sample exhaust, pump, piston, power supply (e.g., at least one of a generator, a remote supply and a battery), vacuum supply, pressure supply, refrigeration (i.e., cooling) unit or supply, heating component, motive force (such as a translational force, propulsional force or a rotational force), magnet, electromagnet, sensor, electrode, transmitter, receiver, transceiver, controller, optical unit, electrical unit or electromechanical unit may be included in support of the various aspects discussed herein or in support of other functions beyond this disclosure.

One skilled in the art will recognize that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A time measurement device for a geologic downhole measurement tool, the device comprising:
    a plurality of oscillators for measuring a time value, at least one of the plurality of oscillators having an oscillation frequency that has a known temperature dependence over a first temperature range and at least another of the plurality of oscillators having an oscillation frequency that has a known temperature dependence over a second temperature range that is different from the first temperature range, wherein the at least one and the at least another of the plurality of oscillators are individually selectable based on an oscillator temperature.

2. The time measurement device of claim 1, wherein the first temperature range and the second temperature range are temperature ranges in which an associated oscillator outputs a frequency that is substantially temperature independent.

3. The time measurement device of claim 1, wherein a temperature range of the selected oscillator includes the oscillator temperature.

4. The time measurement device of claim 1, wherein the device is positioned at a downhole portion of a well logging apparatus.

5. The time measurement device of claim 1, wherein the at least one and the at least another of the plurality of oscillators are selectively connectable to at least one of: (i) a processor for receiving a time signal; and (ii) a power source.

6. A system for time measurement for a geologic downhole measurement tool, the system comprising:
    a plurality of oscillators, wherein at least one of the plurality of oscillators has an oscillation frequency that has a known frequency dependence over a first temperature range and at least another of the plurality of oscillators has an oscillation frequency that has a known frequency dependence over a second temperature range that is different from the first temperature range; and
    a processor for individually selecting one of the at least one and the at least another of the plurality of oscillators to measure a time value based on a temperature.

7. The system of claim 6, wherein a temperature range of the selected oscillator includes the oscillator temperature.

8. The system of claim 6, further comprising a temperature sensor for measuring the oscillator temperature.

9. The system of claim 8, wherein the processor is in operable communication with the plurality of oscillators and the temperature sensor, and the processor receives a temperature from the temperature sensor and selects one of the at least one and the at least another of the plurality of oscillators based on the oscillator temperature.

10. The system of claim 6, further comprising at least one power source in selective operable communication with each of the plurality of oscillators.

11. The system of claim 10, wherein the processor is in operable communication with the power source, and the processor selectively connects the at least one power source to the selected oscillator.

12. The system of claim 6, wherein the first temperature range and the second temperature range overlap, and the processor is configured to receive time values from the at least one and the at least another of the plurality of oscillators and apply at least one statistical operation to the time values.

13. A method for providing a time measurement associated with a geologic downhole measurement, the method comprising:
    positioning a measuring device at a depth of a borehole in a geologic formation, the measuring device comprising a plurality of oscillators, at least one of the plurality of oscillators having an oscillation frequency that has a known frequency dependence over a first temperature range and at least another of the plurality of oscillators having an oscillation frequency that has a known frequency dependence over a second temperature range that is different from the first temperature range; and
    selecting one of the at least one and the at least another of the plurality of oscillators based on an oscillator temperature and measuring a time value with the selected oscillator.

14. The method of claim 13, wherein a temperature range of the selected oscillator includes the oscillator temperature.

15. The method of claim 13, further comprising measuring a property of at least one of the geologic formation and the borehole at the depth.

16. The method of claim 15, further comprising associating the time value with the measured property.

17. The method of claim 13, wherein selecting comprises operably connecting the selected oscillator to at least one of: (i) a processor; and (ii) a power source.

18. The method of claim 13, further comprising processing the time value to convert the time value into a real-time format.

* * * * *